United States Patent
Balzano et al.

(10) Patent No.: US 9,786,474 B2
(45) Date of Patent: Oct. 10, 2017

(54) CATHODIC ARC DEPOSITION APPARATUS AND METHOD

(71) Applicant: United Technologies Corporation, Hartford, CT (US)

(72) Inventors: Thomas Balzano, Manchester, CT (US); Russell A. Beers, Manchester, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 15/027,643

(22) PCT Filed: Sep. 25, 2014

(86) PCT No.: PCT/US2014/057503
§ 371 (c)(1),
(2) Date: Apr. 6, 2016

(87) PCT Pub. No.: WO2015/053956
PCT Pub. Date: Apr. 16, 2015

(65) Prior Publication Data
US 2016/0260583 A1    Sep. 8, 2016

Related U.S. Application Data

(60) Provisional application No. 61/888,182, filed on Oct. 8, 2013.

(51) Int. Cl.
*H01J 37/32* (2006.01)
*C23C 14/32* (2006.01)
(Continued)

(52) U.S. Cl.
CPC ...... *H01J 37/3266* (2013.01); *C23C 14/0635* (2013.01); *C23C 14/0641* (2013.01);
(Continued)

(58) Field of Classification Search
CPC .................................................... H01J 37/3435
See application file for complete search history.

(56) References Cited

U.S. PATENT DOCUMENTS 5,518,597 A * 5/1996 Storer ................... C23C 14/083
                                                          204/192.38
5,932,078 A    8/1999 Beers et al.
(Continued)

FOREIGN PATENT DOCUMENTS

EP    0899773 A2    3/1999
EP    2276053 A1    1/2011

OTHER PUBLICATIONS

International Preliminary Report on Patentability dated Apr. 12, 2016, for corresponding PCT Application No. PCT/US2014/057503.
(Continued)

*Primary Examiner* — Timon Wanga
(74) *Attorney, Agent, or Firm* — Kinney & Lange, P.A.

(57) ABSTRACT

A cathodic arc coating apparatus includes a vessel, a cathode disposed in the vessel, and a stinger assembly. The stinger assembly includes a first magnetic field generator disposed in a first stinger cup in selective contact with the cathode. The first stinger cup has at least a first electrically conductive cup portion spaced from a second electrically conductive cup portion by a thermally insulating layer therebetween.

15 Claims, 3 Drawing Sheets

(51) Int. Cl.
*C23C 14/06* (2006.01)
*C23C 14/08* (2006.01)
*C23C 14/14* (2006.01)
*H01J 37/34* (2006.01)

(52) U.S. Cl.
CPC ........ *C23C 14/0664* (2013.01); *C23C 14/081* (2013.01); *C23C 14/083* (2013.01); *C23C 14/14* (2013.01); *C23C 14/325* (2013.01); *H01J 37/32055* (2013.01); *H01J 37/32522* (2013.01); *H01J 37/32614* (2013.01); *H01J 37/32669* (2013.01); *H01J 37/32816* (2013.01); *H01J 37/3435* (2013.01); *H01J 2237/327* (2013.01); *H01J 2237/332* (2013.01)

(56) References Cited

U.S. PATENT DOCUMENTS

| | | | |
|---|---|---|---|
| 5,972,185 A | 10/1999 | Hendricks et al. | |
| 6,009,829 A | 1/2000 | Ramalingam | |
| 6,036,828 A * | 3/2000 | Beers | H01J 37/32055 118/723 VE |
| 6,224,726 B1 | 5/2001 | Beers et al. | |
| 7,879,203 B2 | 2/2011 | Weaver et al. | |
| 8,387,561 B2 | 3/2013 | Weaver et al. | |
| 2005/0189218 A1 | 9/2005 | Qian et al. | |
| 2006/0124450 A1 | 6/2006 | Beers et al. | |
| 2009/0258165 A1* | 10/2009 | Tryon | C23C 14/16 427/580 |
| 2011/0005925 A1* | 1/2011 | Schnappenberger | H01J 37/3405 204/298.13 |
| 2012/0012057 A1 | 1/2012 | Tryon et al. | |

OTHER PUBLICATIONS

International Search Report and Written Opinion from PCT Application Serial No. PCT/US2014/057503, dated Jan. 19, 2015, 9 pages.

Extended European Search Report for EP Application No. 14852888.8, dated Apr. 19, 2017, 8 pages.

* cited by examiner

CATHODIC ARC DEPOSITION APPARATUS AND METHOD

BACKGROUND

The disclosed subject matter relates generally to vapor deposition and more particularly to cathodic arc vapor deposition.

Cathodic arc vapor deposition typically involves placing one or more workpieces in an evacuated deposition chamber or vessel along with one or more blocks of coating material. An electrical arc is initiated, for example by a trigger, which first contacts the coating material serving as a cathode. As the trigger is moved away from the cathode, the arc jumps between the coating material and an anode, which may be for example, an inside surface of the vessel. The arc vaporizes the cathodic coating material into a plasma, which contains positively charged ions that are attracted toward workpieces to be coated.

Cathodic arc coaters can use water or an aqueous solution to directly or indirectly cool the cathode. With indirect cathode cooling, coolant is provided to directly cool a stinger used to the steer the arc. Cooling the stinger indirectly cools the cathode primarily by conduction. However, high cathode temperatures can cause thermal stress cracking of the cathode due to limitations of the coolant. Higher boiling-point coolants such as glycol can reduce the thermal gradient but increase the risk that the magnets are heated above their Curie temperature, causing loss of magnetic arc steering control.

SUMMARY

A cathodic arc coating apparatus includes a vessel, a cathode disposed in the vessel, and a stinger assembly. The stinger assembly includes a first magnetic field generator disposed in a first stinger cup in selective contact with the cathode. The first stinger cup has at least a first electrically conductive cup portion spaced from a second electrically conductive cup portion by a thermally insulating layer therebetween.

A method for coating a workpiece includes positioning the workpiece in a cathodic arc deposition vessel such that a surface of the workpiece to be coated faces an evaporative surface of the cathode. A portion of the cathode evaporative surface is vaporized by generating an electrical arc between the cathode and an anode disposed in the vessel. The vaporized portion of the cathode is directed toward the workpiece by biasing the surface to be coated with a negative potential equal to or less than a negative potential of the anode. The electrical arc is steered about the cathode by operating a first magnetic field generator disposed in a first multi-part stinger cup in selective contact with the cathode. The first stinger cup has at least a first electrically conductive cup portion spaced from a second electrically conductive cup portion by a thermally insulating layer therebetween.

DETAILED DESCRIPTION

Figure 1:
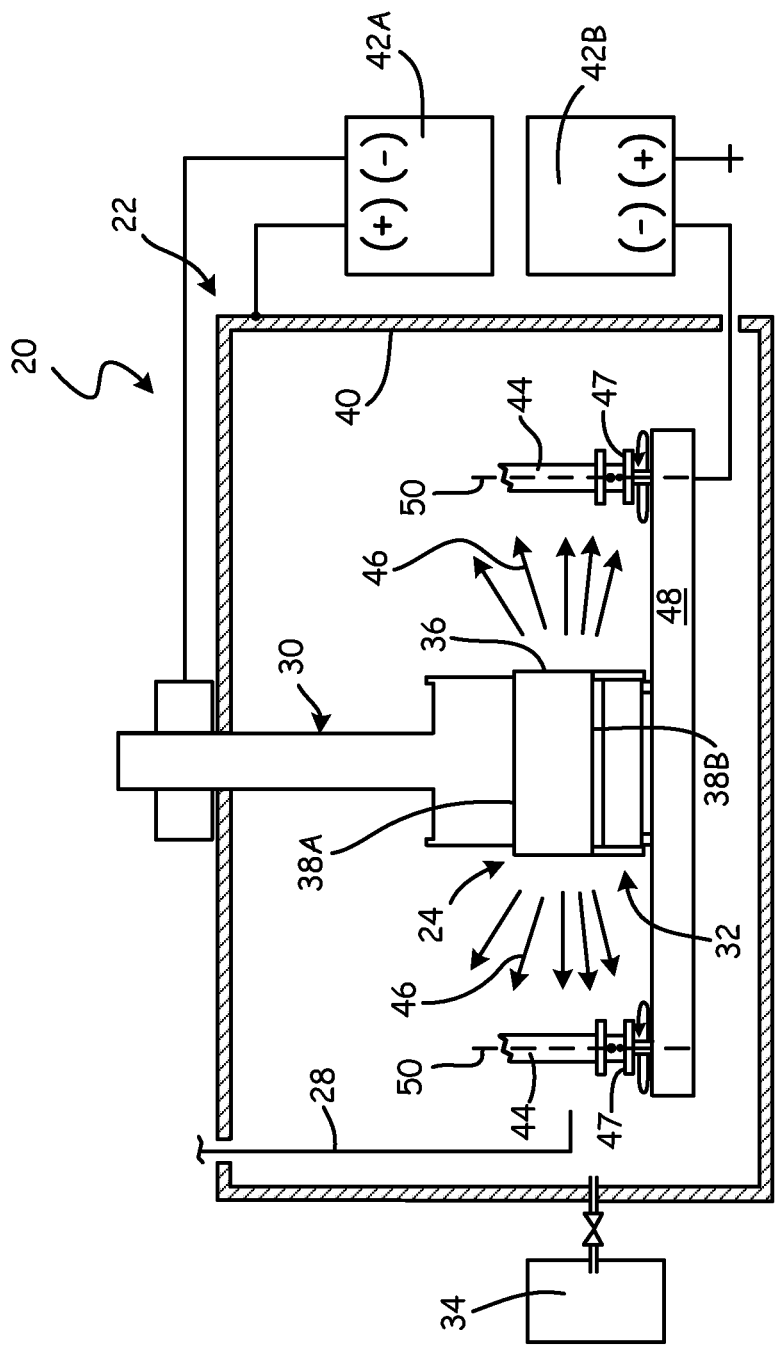
FIG. 1 schematically depicts a cathodic arc deposition apparatus.

FIG. 1 is a schematic view of cathodic arc coating apparatus 20, which includes vessel 22, cathode 24, trigger 28, stinger assembly 30, and base 32. Vessel 22 can be a sealed housing or similar construction able to maintain a vacuum during the coating process with the assistance of one or more vacuum pumps 34. Cathode 24, which can be disposed in one or more locations of vessel 22, has at least one evaporative surface. In this example, cathode 24 can be a puck with evaporative surface 36 extending between first end surface 38A and second end surface 38B. One or more pucks operable as cathode 24 can be formed of a metallic material used in the cathodic arc coating process, such as nickel, cobalt, chromium, aluminum, titanium, yttrium, zirconium, and alloys thereof. Additional or alternative configurations of cathode 24 are also possible, and include toroids, cylinders (both hollow and solid), among others. One or more cathodes 24 can additionally or alternatively be used to form a composite coating.

Trigger 28 is adapted to selectively initiate an arc between cathode 24 and one or more anodes such as inside surface 40 of vessel 22. Additionally or alternatively, one or more separate anodes (not shown) can be disposed in vessel 22. Stinger assembly 30 includes one or more elements to generate rotating magnetic field(s) which steer the electrical arc around cathode 24. To facilitate higher coating power and accommodate the resulting increase in cathode temperatures, cathodic arc coating apparatus 20/stinger 30 can include at least one multi-piece stinger cup (best seen in FIGS. 2 and 3) with at least one thermally insulating channel or layer therebetween.

FIG. 1 shows a plurality of workpieces 44, disposed about an axis of cathode 24 and/or stinger 30. Workpieces 44 can be provided with a negative potential equal or lower than the potential of the anode (e.g., vessel inside surface 40), thereby attracting ions from vapor/plasma cloud 46 generated by movement of an electrical arc about cathode 24. Power supplies 42A, 42B are connected so as to create the required electric potentials in cathode 24 and workpieces 44. Workpieces 44 can rotate on disposed on platter 48. Workpieces 44 can be rotated about individual workpiece axes 50 to ensure desired uniform or non-uniform exposure to the coating ions. Turbine and compressor airfoils are but two examples of workpieces 44 capable of being coated in apparatus 20.

By carefully controlling the atmosphere in vessel 22, and in particular around cathode 24 and workpieces 44, the arc can be sustained so as to form either a metallic or ceramic coating. Maintaining an inert atmosphere can result in vapor/plasma cloud 46 being primarily or exclusively a metallic plasma which is solidified into a metallic coating onto workpiece(s) 44. Non-limiting examples of such metallic coatings can include nickel, cobalt, chromium, aluminum, titanium, yttrium, zirconium, and alloys thereof.

To form a ceramic coating, a suitable atmosphere (for example, air or other gases including one or more of oxygen, nitrogen, and carbon dioxide) under partial pressure, can be introduced into vessel 22. To maintain conductivity of cathode 24 and sustain the arc, this can be done through one or more ports (not shown) around workpiece holders 47. The gas(es) are vaporized by the arc into a nonmetallic plasma and forms a part of vapor/plasma cloud 46 with the metallic plasma from cathode 24. Both the metallic and nonmetallic plasmas are directed to the biased surface(s) of workpiece 44 and solidified to form a ceramic coating. Non-limiting classes of ceramic coatings thus can include oxides, nitrides, carbides, carbo-nitrides, oxycarbo-nitrides, and compatible combinations thereof. Specific non-limiting examples of resulting ceramic coatings can include aluminum oxide, yttrium oxide, zirconium oxide, and titanium nitride as well as compatible combinations thereof. One such example combination results in a yttria stabilized zirconia coating.

Figure 2:
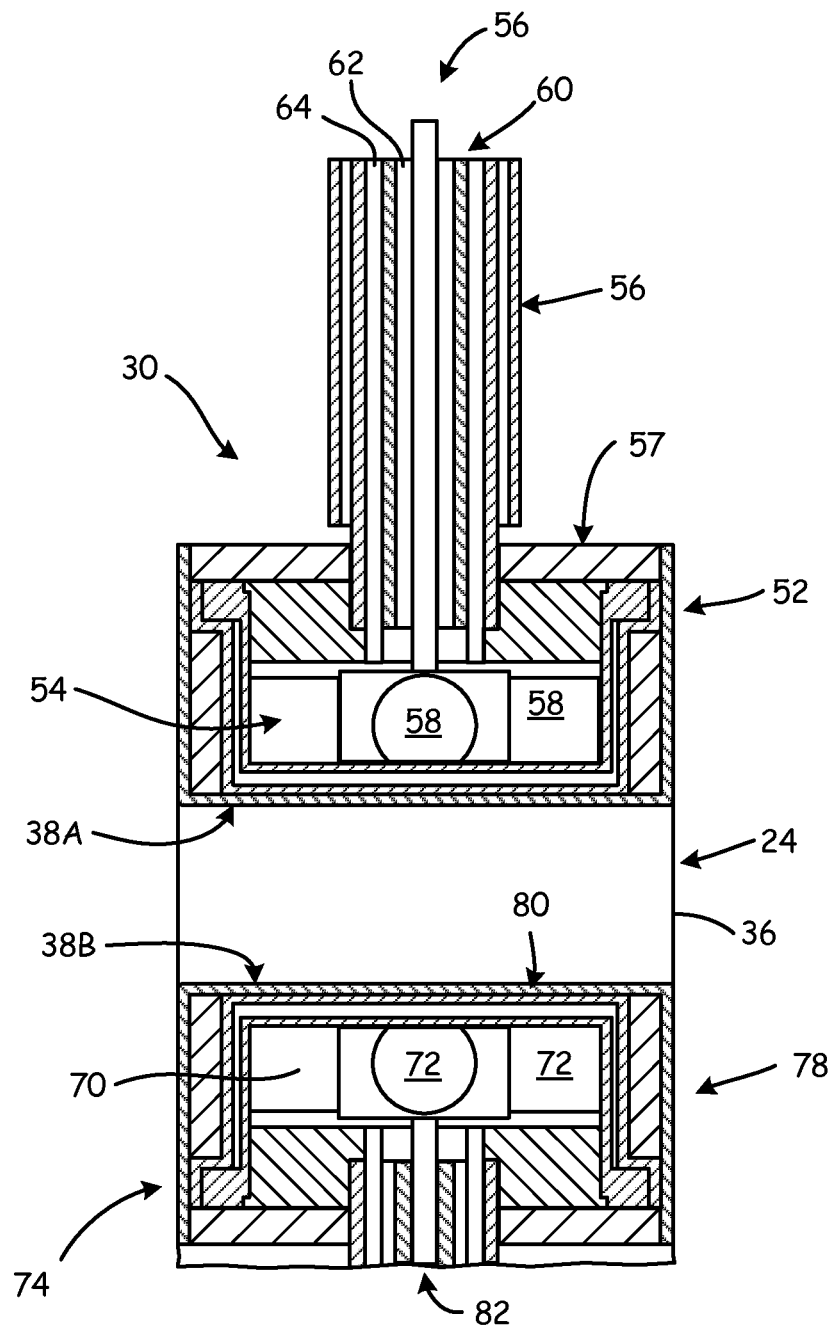
FIG. 2 shows a central portion of the cathodic arc deposition apparatus.

In FIG. 2, stinger assembly 30 includes first stinger cup 52 which carries magnetic field generator 54. First stinger cup 52 can be removably secured to contactor shaft 56 and is selectively actuated to be in contact with first end surface 38A of cathode 24. First stinger cup 52 and contactor shaft 56 of stinger assembly 30 can be fabricated from an electrically conductive material such as a copper alloy. A first magnetic field generator 54, which may be enclosed by cover 57, can include, for example, a plurality of magnets 58. Magnets 58 are disposed in first stinger cup 52, and can be cooled by water or an aqueous solution via cooling tube 60. Cooling tube 60 can be coaxially positioned with contactor shaft 56 having coaxial ports 62 and 64. This arrangement allows coolant to efficiently enter and exit first magnetic field generator 54 via cooling tube 60.

As is generally known, one or more of magnets 58 can be manipulated so as to create a rotating or otherwise traveling magnetic field adapted to steer the electric arc about cathode 24, ensuring even displacement of coating material from evaporative surface(s) 36. Magnets 58 can be permanent magnets, electromagnets, or the like, and thus operated (e.g., via rotation, switching, etc.) to steer the electric arc in any desired manner.

First stinger cup 52 can have a multi-part configuration so as to provide increased thermal separation between magnetic field generator 54 and cathode 24. Large thermal gradients can be present in the stinger cup as a result of cooling requirements for the magnetic field generator. In configurations having a solid or single-piece stinger cup, a large thermal gradient through the cup, between the magnets and the cathode, results in thermal stress cracking of the cathode. Reducing the cooling rate to manage the thermal gradient can increase the risk of coolant boiling, creating damaging steam in systems designed for liquid coolant. Though a higher temperature coolant can be used (e.g., by substituting glycol for some or all of the water), this can only partially alleviate thermal stress issues. At higher coolant temperatures, the temperature of the stinger and the coolant can increase above the Curie temperature of the magnets, which in turn can cause loss of arc steering control due to a weakened or lost magnetic field.

In contrast, multi-piece first stinger cup 52 (e.g., at least a top cup portion and a bottom cup portion) thermally separates liquid-cooled magnetic field generator 54 from cathode(s) 24. An insulating layer between adjacent spaced pieces of first stinger cup 52 (best seen in FIG. 3), allows for a larger thermal gradient between stinger assembly 30 and cathode(s) 24 without reducing effectiveness of first magnetic field generator 54.

In certain embodiments, apparatus 20 includes a second magnetic field generator 70. Second magnetic field generator 70 can be, for example, a second plurality of magnets 72 disposed within cathode support base 74. Cathode support base 74, electrically insulated from vessel 22, can include second stinger cup 78. In this example, second stinger cup 78 is inverted relative to first stinger cup 52 such that second end surface 38B of cathode 24 can rest upon a substantially flat cup surface 80. Thus in certain of these embodiments, cathode support base 74 can operate (in conjunction with second magnetic field generator 70) as an optional second stinger assembly with a construction similar to that of stinger assembly 30. Second cooling mechanism 82 (similar to first cooling tube 60) can also be provided for second magnetic field generator 70. In certain embodiments, second stinger cup 78 can also be a multi-part stinger cup also having at least first and second electrically conductive cup portions spaced apart by a thermally insulating layer.

Figure 3:
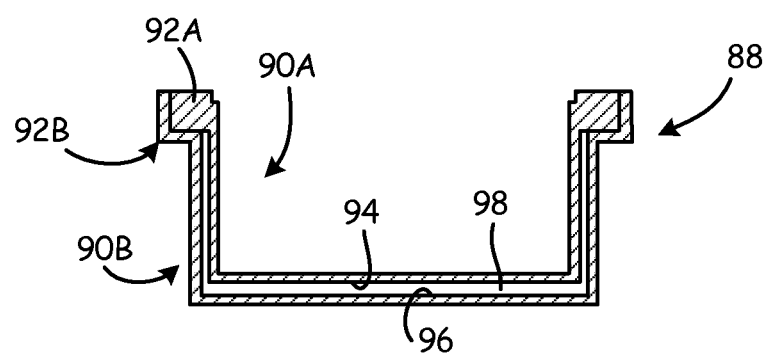
FIG. 3 is a detailed view of an example multi-part stinger cup for use in the apparatus of FIGS. 1 and 2.

FIG. 3 shows an example two-part stinger cup 88 suitable for use as first stinger cup 52 and/or second stinger cup 72. Example stinger cup 88 includes first electrically conductive inner cup portion 90A with first radial flange 92A. Second electrically conductive outer cup portion 90B (with second radial flange 92B) is disposed about first inner cup portion 90A such that outer surface 94 of first inner cup portion 90A is spaced from a corresponding inner surface 96 of second outer cup portion 90B by thermally insulating layer 98. At least one of first and second cup portions 90A, 90B can be formed of a similar material as other parts of the stinger, such as copper or a copper alloy.

As seen in FIG. 3, first and second cup portions 90A, 90B can be joined around respective radial flanges 92A, 92B to leave non-metallic thermally insulating layer 98. In certain embodiments, thermally insulating layer 98 can include small amounts of residual air though it is generally maintained under vacuum. This can be done for example by sealing first and second cup portions 90A, 90B around respective radial flanges 92A, 92B in a reduced-pressure atmosphere. While stinger cup 88 is shown as a two-part cup with a single thermally insulating layer, it will be appreciated that three or more cup portions can be used with additional thermally insulating layer(s) therebetween.

Summarizing example processes for coating a workpiece, embodiments of apparatus 20 as shown in FIGS. 1-3 can include various modes of operation including the following. One or more workpieces, which may include at least one turbine or compressor airfoil, can be positioned in a cathodic arc deposition vessel such that a surface of the workpiece to be coated faces an evaporative surface of the cathode. A portion of a cathode's evaporative surface can be vaporized by generating an electrical arc between the cathode and an anode disposed in the vessel. As noted with respect to FIG. 1, the anode can be an inner surface of the vessel.

The vaporized portion of the cathode is directed toward the workpiece(s) by biasing the surface to be coated with a negative potential equal to or less than a negative potential of the anode. The workpiece(s) can be negatively biased, for example, by one or more power supplies in electrical communication therewith.

The electrical arc is steered about the cathode by operating a first magnetic field generator, which can be disposed in a first multi-part stinger cup in selective contact with the cathode. As shown in FIGS. 2 and 3, the first stinger cup can have at least a first electrically conductive cup portion spaced from a second electrically conductive cup portion by a thermally insulating layer therebetween. At least one of the first cup portion and the second cup portion can include copper or an alloy thereof. The thermally insulating layer can be a non-metallic composition such as air. The thermally insulating layer can be maintained under partial vacuum.

In certain embodiments, the electrical arc can be further steered by operating a second magnetic field generator disposed within a second stinger cup, which forms at least a portion of a cathode support base. In certain of these embodiments, the second stinger cup can also include a multi-part cup with at least one electrically conductive cup portion spaced from other electrically conductive cup portion(s) by a thermal insulating layer.

Discussion of Possible Embodiments

The following are non-exclusive descriptions of possible embodiments of the present disclosure.

A cathodic arc coating apparatus includes a vessel, a cathode disposed in the vessel, and a stinger assembly. The stinger assembly includes a first magnetic field generator disposed in a first stinger cup in selective contact with the cathode. The first stinger cup has at least a first electrically conductive cup portion spaced from a second electrically conductive cup portion by a thermally insulating layer therebetween.

The cathodic arc coating apparatus of the preceding paragraph can optionally include, additionally and/or alternatively, any one or more of the following features, configurations and/or additional components:

A cathodic arc coating apparatus according to an exemplary embodiment of this disclosure, among other possible things includes a vessel; a cathode disposed in the vessel, the cathode having at least one evaporative surface; and a stinger assembly including at least a first magnetic field generator disposed in a first stinger cup in selective contact with the cathode; the first stinger cup having at least a first electrically conductive cup portion spaced from a second electrically conductive cup portion by a thermally insulating layer therebetween.

A further embodiment of the foregoing cathodic arc coating apparatus, wherein at least one of the first electrically conductive cup portion and second electrically conductive cup portion is in selective contact with a first end surface of the cathode.

A further embodiment of any of the foregoing cathodic arc coating apparatus, wherein the cathode includes a puck comprising a metallic coating material.

A further embodiment of any of the foregoing cathodic arc coating apparatus, wherein the metallic coating material comprises nickel, cobalt, chromium, aluminum, titanium, yttrium, zirconium, and alloys thereof.

A further embodiment of any of the foregoing cathodic arc coating apparatus, wherein the vessel contains an inert atmosphere.

A further embodiment of any of the foregoing cathodic arc coating apparatus, wherein the vessel contains a gas under partial pressure, the gas selected from the group consisting of: oxygen, nitrogen, carbon dioxide, and combinations thereof.

A further embodiment of any of the foregoing cathodic arc coating apparatus, wherein the apparatus further comprises a platter including a plurality of workpiece holders disposed about an axis of the cathode.

A further embodiment of any of the foregoing cathodic arc coating apparatus, wherein the workpiece holders are each adapted to retain at least one airfoil.

A further embodiment of any of the foregoing cathodic arc coating apparatus, wherein at least one of the first cup portion and the second cup portion comprises copper.

A further embodiment of any of the foregoing cathodic arc coating apparatus, wherein the thermally insulating layer is non-metallic.

A further embodiment of any of the foregoing cathodic arc coating apparatus, wherein the thermally insulating layer comprises air.

A further embodiment of any of the foregoing cathodic arc coating apparatus, wherein the thermally insulating layer is maintained under partial vacuum.

A further embodiment of any of the foregoing cathodic arc coating apparatus, wherein the apparatus further comprises a cathode support base secured to, and electrically insulated from the vessel.

A further embodiment of any of the foregoing cathodic arc coating apparatus, wherein the apparatus further comprises a second magnetic field generator disposed within the cathode support base.

A further embodiment of any of the foregoing cathodic arc coating apparatus, wherein the cathode support base comprises a second multi-part stinger cup, and the second multi-part stinger cup has at least a first electrically conductive cup portion spaced from a second electrically conductive cup portion by a thermally insulating layer.

A method for coating a workpiece includes positioning the workpiece in a cathodic arc deposition vessel such that a surface of the workpiece to be coated faces an evaporative surface of the cathode. A portion of the cathode evaporative surface is vaporized by generating an electrical arc between the cathode and an anode disposed in the vessel, the vaporized portion of the cathode forming a metallic plasma. The metallic plasma is directed toward the workpiece by biasing the surface to be coated with a negative potential equal to or less than a negative potential of the anode. The electrical arc is steered about the cathode by operating a first magnetic field generator disposed in a first multi-part stinger cup in selective contact with the cathode. The first stinger cup has at least a first electrically conductive cup portion spaced from a second electrically conductive cup portion by a thermally insulating layer therebetween.

The method of the preceding paragraph can optionally include, additionally and/or alternatively, any one or more of the following features, configurations and/or additional components:

A method according to an exemplary embodiment of this disclosure, among other possible things includes positioning the workpiece in a cathodic arc deposition vessel such that a surface of the workpiece to be coated faces an evaporative surface of the cathode; vaporizing a portion of the cathode evaporative surface by generating an electrical arc between the cathode and an anode disposed in the vessel, the vaporized portion of the cathode forming a metallic plasma; directing the metallic plasma toward the workpiece by biasing the surface to be coated with a negative potential equal to or less than a negative potential of the anode; and steering the electrical arc about the cathode by operating a first magnetic field generator; the magnetic field generator disposed in a first multi-part stinger cup in selective contact with the cathode, and the first stinger cup having at least a first electrically conductive cup portion spaced from a second electrically conductive cup portion by a thermally insulating layer therebetween.

A further embodiment of the foregoing method, wherein the method further comprises positioning a plurality of workpieces in the vessel such that a surface of each workpiece to be coated faces the evaporative surface of the cathode.

A further embodiment of any of the foregoing methods, wherein the plurality of workpieces include at least one airfoil.

A further embodiment of any of the foregoing methods, wherein at least one of the first cup portion and the second cup portion comprises copper.

A further embodiment of any of the foregoing methods, wherein the thermally insulating layer is non-metallic.

A further embodiment of any of the foregoing methods, wherein the thermally insulating layer comprises air.

A further embodiment of any of the foregoing methods, wherein the method further comprises maintaining the thermally insulating layer under partial vacuum.

A further embodiment of any of the foregoing methods, wherein the steering step further comprises operating a second magnetic field generator disposed within a second stinger cup.

A further embodiment of any of the foregoing methods, wherein the second stinger cup forms at least a portion of a cathode support base.

A further embodiment of any of the foregoing methods, wherein the second stinger cup comprises a multi-part cup with a first electrically conductive cup portion spaced from a second electrically conductive cup portion by a thermally insulating layer.

A further embodiment of any of the foregoing methods, wherein the cathode comprises a puck including the evaporative surface formed from a first metallic material.

A further embodiment of any of the foregoing methods, wherein the first metallic material is selected from the group consisting of: nickel, cobalt, chromium, aluminum, titanium, yttrium, zirconium, and alloys thereof.

A further embodiment of any of the foregoing methods, wherein the method further comprises maintaining an inert atmosphere in the vessel; and solidifying the metallic plasma to form a metallic coating on the workpiece.

A further embodiment of any of the foregoing methods, wherein the method further comprises introducing at least one gas into the vessel such that the electrical arc vaporizes a portion of the at least one gas to form a nonmetallic plasma; directing the nonmetallic plasma to the biased surface of the workpiece; and solidifying the nonmetallic plasma along with the metallic plasma to form a ceramic coating on the workpiece.

A further embodiment of any of the foregoing methods, wherein the at least one gas is selected from the group consisting of: oxygen, nitrogen, carbon dioxide, and combinations thereof.

A further embodiment of any of the foregoing methods, wherein a class of the ceramic coating material is selected from the group consisting of: oxides, nitrides, carbides, carbo-nitrides, oxycarbo-nitrides, and combinations thereof.

A further embodiment of any of the foregoing methods, wherein the ceramic coating material is selected from the group consisting of: aluminum oxide, yttrium oxide, zirconium oxide, titanium nitride, and combinations thereof.

Although the present invention has been described with reference to preferred embodiments, workers skilled in the art will recognize that changes may be made in form and detail without departing from the spirit and scope of the invention.

The invention claimed is:

1. A cathodic arc coating apparatus comprising:
a vessel;
an anode spaced apart from a cathode disposed in the vessel, the cathode having at least one evaporative surface;
a first power supply configured to bias the cathode with a positive potential;
means for retaining at least one workpiece in the vessel so that the at least one workpiece is exposed to the at least one evaporative surface;
means for initiating an electrical arc between the anode and the cathode for vaporizing a portion of the evaporative surface to form a metallic plasma;
a second power supply configured to bias the at least one workpiece with a negative potential equal to or less than a negative potential of the anode, thereby directing the metallic plasma toward the at least one workpiece; and
a stinger assembly for steering the electric arc over the evaporative surface of the cathode, the stinger assembly including at least a first magnetic field generator disposed in a first electrically conductive cup portion joined to a second electrically conductive cup portion in selective contact with the cathode, defining a first stinger cup having a thermally insulating layer between the first electrically conductive cup portion and the second electrically conductive cup portion such that the thermally insulating layer is disposed directly between the first magnetic field generator and the cathode when the first stinger cup is in contact with the cathode.

2. The apparatus of claim 1, wherein the cathode includes a puck comprising an evaporative surface formed of a metallic material.

3. The apparatus of claim 2, wherein the metallic material comprises a metal selected from the group consisting of: nickel, cobalt, chromium, aluminum, titanium, yttrium, zirconium, and alloys thereof.

4. The apparatus of claim 1, wherein the vessel contains an inert atmosphere.

5. The apparatus of claim 1, wherein the vessel contains a gas under partial pressure, the gas selected from the group consisting of: oxygen, nitrogen, carbon dioxide, and combinations thereof.

6. The apparatus of claim 1, further comprising:
a platter supporting a plurality of workpiece holders, including the first workpiece holder, about an axis of the cathode.

7. The apparatus of claim 6, wherein at least one of the plurality of workpiece holders is adapted to retain at least one airfoil.

8. The apparatus of claim 1, wherein at least one of the first cup portion and the second cup portion comprises copper.

9. The apparatus of claim 1, wherein the thermally insulating layer is non-metallic.

10. The apparatus of claim 9, wherein the thermally insulating layer comprises air.

11. The apparatus of claim 9, wherein the thermally insulating layer is maintained under partial vacuum.

12. The apparatus of claim 1, further comprising a cathode support base secured to, and electrically insulated from the vessel.

13. The apparatus of claim 12, further comprising: a second magnetic field generator disposed within the cathode support base.

14. The apparatus of claim 13, wherein the cathode support base comprises a second multi-part stinger cup, the second multi-part stinger cup having at least a first electrically conductive cup portion spaced from a second electrically conductive cup portion by a thermally insulating layer therebetween.

15. The apparatus of claim 1, wherein the first electrically conductive cup portion is joined to the second electrically conductive cup portion via respective first and second radial flanges.

* * * * *